United States Patent
Jinbo et al.

(10) Patent No.: US 6,608,781 B1
(45) Date of Patent: Aug. 19, 2003

(54) NONVOLATILE SEMICONDUCTOR MEMORY DEVICE APPLYING POSITIVE SOURCE AND SUBSTRATE VOLTAGES DURING A PROGRAMMING PERIOD

(75) Inventors: Toshikatsu Jinbo, Tokyo (JP); Kazuo Watanabe, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 166 days.

(21) Appl. No.: 09/650,158

(22) Filed: Aug. 28, 2000

(30) Foreign Application Priority Data

Aug. 30, 1999 (JP) .......................................... 11-242912

(51) Int. Cl.⁷ ................................................. G11C 7/00
(52) U.S. Cl. ............................... 365/189.09; 365/185.27
(58) Field of Search ....................... 365/185.27, 185.24, 365/185.09

(56) References Cited

U.S. PATENT DOCUMENTS 5,793,678 A * 8/1998 Kato et al. ............. 365/185.27
5,841,165 A * 11/1998 Chang et al. ................ 257/318

FOREIGN PATENT DOCUMENTS

| JP | 57-205895 | 12/1982 | |
| JP | 405145045 | * 6/1993 | .......... G11C/16/02 |
| JP | 5-210991 | 8/1993 | |
| JP | 6-275842 | 9/1994 | |

OTHER PUBLICATIONS

Jian Chen et al., Study of Over Erase Correction Convergence Point Vth In Flash EPROM Cell, 1994, pp. 68–69.*

* cited by examiner

Primary Examiner—M. Tran
(74) Attorney, Agent, or Firm—McGinn & Gibb, PLLC

(57) ABSTRACT

According to the present invention, a voltage of 10.5 V, a voltage of 6.5 V and a voltage of 0.5 V are respectively applied to the control gate, the drain and the source of a memory cell that is a programming target. And a voltage of 0 V (a ground voltage) is applied to the control gate of a memory cell that is not a programming target and that does not belong to the row in which of the programming target memory cell is located. As a result, it is ensured that the memory cell that is not the programming target is non-conductive, and that the drain-substrate electrical field of the memory cell that is the programming target is reduced.

17 Claims, 16 Drawing Sheets

|  | W0 | W1 | D0 | D1 | Vs | Vb |
|---|---|---|---|---|---|---|
| READING(M00) | 5V | 0V | 1V | OPEN | 0V | 0V |
| PROGRAM(M00) | 10.5V | 0V | 6.5V | OPEN | 0.5V | 0.5V |
| ERASING (SUBSTRATE ERASING) | -10V | -10V | OPEN | OPEN | OPEN | 10V |
| ERASING (SOURCE-GATE ERASING) | -10V | -10V | OPEN | OPEN | 10V | 0V |

Fig.16

|  | W0 | W1 | D0 | D1 | Vs | Vb |
|---|---|---|---|---|---|---|
| READING(M00) | 5V | 0V | 1V | OPEN | 0V | 0V |
| PROGRAM(M00) | 10V | 0V | 6V | OPEN | 0V | 0V |
| ERASING (SUBSTRATE ERASING) | -10V | -10V | OPEN | OPEN | OPEN | 10V |
| ERASING (SOURCE-GATE ERASING) | -10V | -10V | OPEN | OPEN | 10V | 0V |

Fig.17

NONVOLATILE SEMICONDUCTOR MEMORY DEVICE APPLYING POSITIVE SOURCE AND SUBSTRATE VOLTAGES DURING A PROGRAMMING PERIOD

BACKGROUND OF THE INVENTION

1. Field of the Invention

The present invention relates to a nonvolatile semiconductor memory device and a programming method therefor, and relates in particular to a nonvolatile semiconductor memory device (a flash memory) and a programming method therefor.

2. Description of Related Arts

At present, various types of nonvolatile semiconductor memory devices, such as mask ROMs, EEPROMs and flash memories, are available. Of these devices, an electrically rewritable flash memory that is appropriate for high integration has drawn the attention of many people (see Japanese Unexamined Patent Publication No. Hei 6-275842). For nonvolatile memory, in principle, one transistor constitutes one memory cell, and since basically no selection transistors are required and a memory cell occupies only a small area, originally the data held by a single memory cell could not be erased. Now, however, with flash memory, data erasing is performed collectively by blocks.

Memory cells (a circuit) in a flash memory are shown in FIG. 11. In FIG. 11, a source voltage Vs and a substrate voltage Vb are used in common by four memory cells M00, M01, M10 and M11. The control gates of the memory cells M00 and M01 are connected in common to a row line W0 while the control gates of the memory cells M10 and M11 are connected in common to a row line W1, and the drain electrodes of the memory cells M00 and M10 are connected in common to a column line D0 while the drain electrodes of the memory cells M01 and M11 are connected in common to a column line D1.

The threshold value of each memory cell, viewed from its control gate, differs, depending on whether electrons have accumulated at its floating gate. That is, when no electrons have accumulated at a cell's floating gate, the threshold value viewed from its control gate is reduced, and when electrons have accumulated at the cell's floating gate, the threshold value viewed from its control gate is increased. This cell characteristic makes the nonvolatile storage of information possible.

An explanation will now be given, while referring to FIG. 17, of the voltages that are applied to the electrodes of the memory cell M00 in FIG. 11 during the data reading, the data programming (writing) and the data erasing processes.

First, when data are to be read from the memory cell M00, as is shown in FIG. 17 the voltage set for the row line W0 is 5 V, for the row line W1 is 0 V and for the column line D0 is 1 V, while the column line D1 is open and the voltage set for both the source voltage Vs and the substrate voltage Vb is 0 V. Thus, upon the application of 5 V to the control gate of the memory cell M00 and 1 V to the drain, the memory cell transistor is rendered conductive if the threshold value of the memory cell M00 is low (equal to or below 5 V), or is rendered non-conductive if the threshold value of the memory cell M00 is high (above 5 V). The conductive/non-conductive control is performed in accordance with whether a reading circuit (not shown) detects the flowing of a drain current.

When the memory cell M00 is to be programmed, as is shown in FIG. 17 the voltage set for the row line W0 is 10 V, for the row line W1 it is 0 V and for the column line D0 it is 6 V, while the column line D1 is open and the voltage set for both the source voltage Vs and the substrate voltage Vb is 0 V. Thus, since a voltage of 10 V is applied to the control gate of the memory cell M00 and a voltage of 6 V is applied to the drain, a hot carrier is injected into the floating gate of the memory cell M00, and the threshold value of the memory cell M00 is increased as described above.

For erasing data, there are a "substrate erasing method," for discharging, to the substrate, the electrons accumulated at the floating gate, and a "source-gate erasing method," for discharging the accumulated electrons to the source. According to the substrate erasing method, as is shown in FIG. 17 the voltage set for both the row lines W0 and W1 is −10 V, while the column lines D0 and D1 and the source voltage Vs are open and the voltage set for the substrate voltage Vb is 10 V. Thus, since a voltage of −10 V is applied to the control gate of each memory cell while a voltage of 10 V is applied to the substrate, the electrons accumulated at the floating gate are discharged to the substrate, and not only are the data in the memory cell M00 erased, but the data in all the other memory cells are also erased, collectively. According to the source-gate erasing method, as is shown in FIG. 17 the voltage set for both the row lines W0 and W1 is −10 V, while the column lines D0 and d1 are open and the voltage set for both the source voltage Vs and the substrate voltage Vb is 10 V. Thus, since a voltage of −10 V is applied to the control gate of each memory cell and a voltage of 10 V is applied to the source, the electrons accumulated at the floating gate are discharged to the source, and data in all the memory cells are collectively erased.

The substrate erasing method and the source-gate erasing method differ greatly in that, for the substrate erasing method, the substrate voltage Vb must be a positive high voltage, while for the source-gate method, the substrate voltage Vb is 0 V both for data programming and for data erasing. This difference is reflected in the device structures used for the two methods.

That is, the device structure appropriate for the substrate erasing method is as shown in FIG. 12, and the device structure appropriate for the source-gate erasing method is as shown in FIG. 13.

In the structure in FIG. 12, an N well 2 is formed in a P semiconductor substrate 1, a P well 3 is formed in the N well 2, and a memory cell is formed in the P well 3. An N diffusion layer 4 is formed in the N well 2, while a P diffusion layer 5, an N source diffusion layer 6 and an N drain diffusion layer 7 are formed in the P well 3. A floating gate 8 and a control gate 9 are provided above a channel between the N source diffusion layer 6 and the N drain diffusion layer 7. The individual regions are defined by field insulating films 10.

Since with this arrangement a positive voltage can be applied to the substrate, this structure is appropriate for the substrate erasing method.

In the structure in FIG. 13, the N well 2 and the P well 3 are not included, and a memory cell transistor is formed directly in a P semiconductor substrate 1. Since with this arrangement a positive voltage can not be applied to the substrate, this structure is appropriate for the source-gate erasing method. In this structure, a voltage of 0 V is constantly applied to the substrate.

According to either method, since as is described above the erasing of data is performed collectively for a plurality of memory cells, the erasing level differs for each memory cell. This means variances in the threshold voltages of the memory cells are produced after the data are erased, and a negative threshold value may be held by some memory cells.

As is described above, information is stored in a memory cell in accordance with whether during the reading process the threshold value held by the pertinent memory cell is equal to or lower than the row line voltage. Since in a flash memory a selection transistor is not provided for each memory cell, the threshold value must, at the least, be positive. If the threshold value is negative, the memory cell is rendered conductive, even when it is not selected, and selecting the memory cell is a meaningless effort.

Specifically, when the threshold value of a memory cell falls and becomes negative, during the reading process, deterioration of the reading characteristic occurs. Assume that the threshold value of the memory cell M10 in FIG. 11 falls and becomes negative, and that data are to be read from the memory cell in the programmed state (the cell has a high threshold value). Since the memory cell M00 is in the programmed state, it is not rendered conductive even upon the application of a read voltage (5 V) to the row line W0. However, the memory cell 10, which has a negative threshold value, is rendered conductive, even though the voltage at the row line W1 is 0 V, and as a result, a current flows from the column line D0, via the memory cell M10, to the source. Therefore, the reading circuit may erroneously determine that the memory cell M00 is in the erased state (the cell has a low threshold value).

The presence during the programming process of a memory cell that has a negative threshold voltage also causes the program characteristic to be deteriorated. Similarly, assume that the threshold voltage of the memory cell M10 is negative and that the memory cell M00 is to be programmed. Even though the voltage at the row line W1 is 0 V, the memory cell M10, which has a negative threshold value, is rendered conductive, and a current flows from the column line D0, via the memory cell M10, to the source. Therefore, the voltage at the column line D0 drops, and either the programming of the memory cell M00 is unsatisfactory, or, in some cases, a programming disabled state is entered. Further, since the drain voltage (6 V) during the programming process is higher than the drain voltage (1 V) during the reading process, compared with the reading process, a larger current, a leak, flows across the memory cell that has the negative threshold value during the programming process. Thus, drastic deterioration of the programming characteristic occurs.

A method for preventing the deterioration of the programming characteristic, as a result of the presence of a memory cell having a negative threshold voltage, is disclosed, for example, in Japanese Unexamined Patent Publication No. Hei 5-210991.

According to the method described in this publication, during the programming process a negative voltage is applied to the control gate of a memory cell that is not to be programmed. Specifically, as is shown in FIG. 14, a voltage of 10 V is applied to a row line W0 by a row decoder 34 to apply 10 V to the control gate of a memory cell M00 that is to be programmed, while a negative voltage of −0.5 V is applied to a row line W1 to load a negative voltage into the control gate of a memory cell M10 that is not to be programmed. Thus, even when the threshold voltage of the memory cell M10, which is not a programming target, falls to a negative value, the probability is greater that the memory cell M10 can be rendered non-conductive, and that the programming of the memory cell M00 can be performed correctly.

Another method for preventing the deterioration of the programming characteristic, as a result of the presence of a memory cell having a negative threshold voltage, is disclosed, for example, in Japanese Unexamined Patent Publication No. Sho 57-205895.

According to the method disclosed in this publication, during the programming process, the voltage set for a source voltage Vs is higher than the voltage at the control gate of a memory cell that is not to be programmed. Specifically, as is shown in FIG. 15, assuming that a memory cell M00 is a programming target, the voltage set for a column D0 is 6.5 V, a column D1 is open, the voltages set for row lines W0 and W1 are 10.5 V and 0 V, respectively, and the voltage set for a source voltage Vs is 0.5 V. Thus, because the gate-source voltage during the programming process is −0.5 V, even when the threshold value for a memory cell M10 that is not a programming target falls to a negative value, as with the method described in Japanese Unexamined Patent Publication No. Hei 5-210991, the probability is greater that the memory cell M10 can be rendered non-conducive, and that the programming for the memory cell M00 can be performed correctly.

It should be noted that each of the voltages applied to the control gate, the source and the drain of the memory cell M00, which is the programming target, is increased by 0.5 V, as shown in FIG. 17, the relationship between the control gate voltage, the source voltage and the drain voltage of the memory cell M00 is maintained.

With the method in FIG. 14 that is disclosed in Japanese Unexamined Patent Publication No. Hei 5-210991, however, not only is a program voltage supply circuit 30 required, but also a negative voltage supply circuit 32 for providing a voltage of −0.5 V must be supplied. Furthermore, the row decoder 343 must also apply a voltage of 10 V to a row line to be selected, and a voltage of −0.5 V to a row line that is not selected. Therefore, the control mechanism is complicated, and as a result, the size of the circuit is increased. Furthermore, since during the actual program processing a negative voltage must be applied to all the Lines that are not selected, and for this a wait time is required, the total programming time is increased.

In addition, according to the method in FIG. 15 that is disclosed in Japanese Unexamined Patent Publication No. Sho 57-205895, the relationship shown in FIG. 17 is maintained for the control gate voltage, the source voltage and the drain voltage of the memory cell that is the programming target. So that when taking into consideration the relationship with the substrate voltage, the voltage difference is increased. Specifically, the difference between the substrate voltage and the drain voltage is 6 V in FIG. 17, while the difference provided by the method in the referenced publication is 6.5 V.

This means that the ability to withstand the voltage that the diffusion layer requires must be increased. Thus, when taking into account the increase in the impurity density of the substrate, which is required to prevent punch through, since the development of the high definition technique it has been difficult to increase the ability of the drain diffusion layer to withstand damage. And therefore, the method disclosed in the referenced publication may reduce the reliability of a product.

SUMMARY OF THE INVENTION

It is, therefore, one objective of the present invention to provide a nonvolatile semiconductor memory device that minimizes the size of a circuit and that prevents the deterioration of a programming characteristic, which is due to the presence of a memory cell having a negative threshold voltage, and a programming method therefor.

It is another objective of the present invention to provide a nonvolatile semiconductor memory device that suppresses the extension of a programming time and that prevents the deterioration of a programming characteristic, which is due to the presence of a memory cell having a negative threshold voltage, and a programming method therefor.

It is an additional objective of the present invention to provide a nonvolatile semiconductor memory device that does not require an increase in the ability of a drain diffusion layer to withstand and prevent the deterioration of a programming characteristic, which is due to the presence of a memory cell having a negative threshold voltage, and a programming method therefor.

According to the present invention, a nonvolatile semiconductor memory device is provided wherein, during a programming process, a source voltage and a substrate voltage, for each of a plurality of memory cell transistors, are set to a positive voltage. Thus, the deterioration of a programming characteristic, which is caused by the presence of a memory cell having a negative threshold value, can be prevented, and the above objectives can be achieved.

BRIEF DESCRIPTION OF THE DRAWINGS

This above-mentioned and other objects, features and advantages of this invention will become more apparent by reference to the following detailed description of the invention taken in conjunction with the accompanying drawings, wherein:

FIG. 16 is a diagram showing a voltage to be applied to each electrode in the nonvolatile semiconductor memory device according to the present invention; and FIG. 17 is a diagram showing a voltage to be applied to each electrode in a conventional nonvolatile semiconductor memory device.

DETAILED DESCRIPTION OF THE PREFERRED EMBODIMENTS

Figure 1:
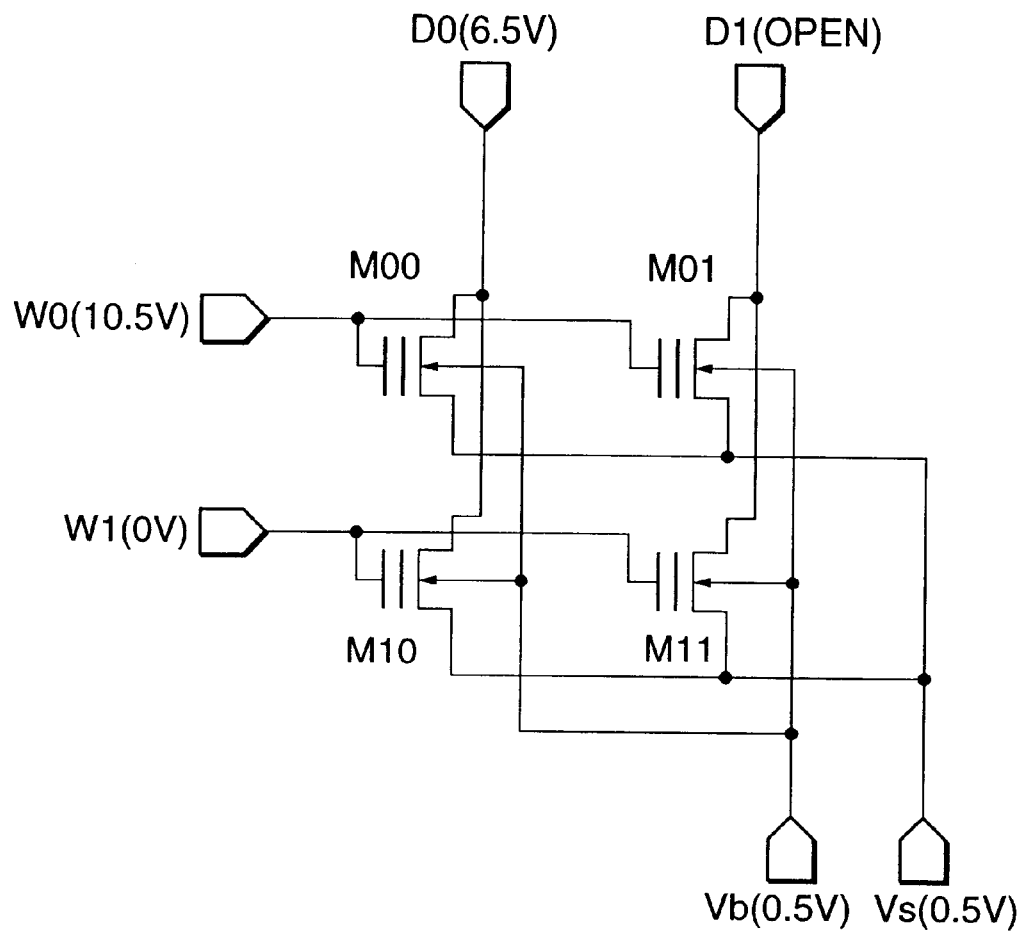
FIG. 1 is a circuit diagram showing an essential portion of a nonvolatile semiconductor memory device according to one embodiment of the present invention.
Figure 11:
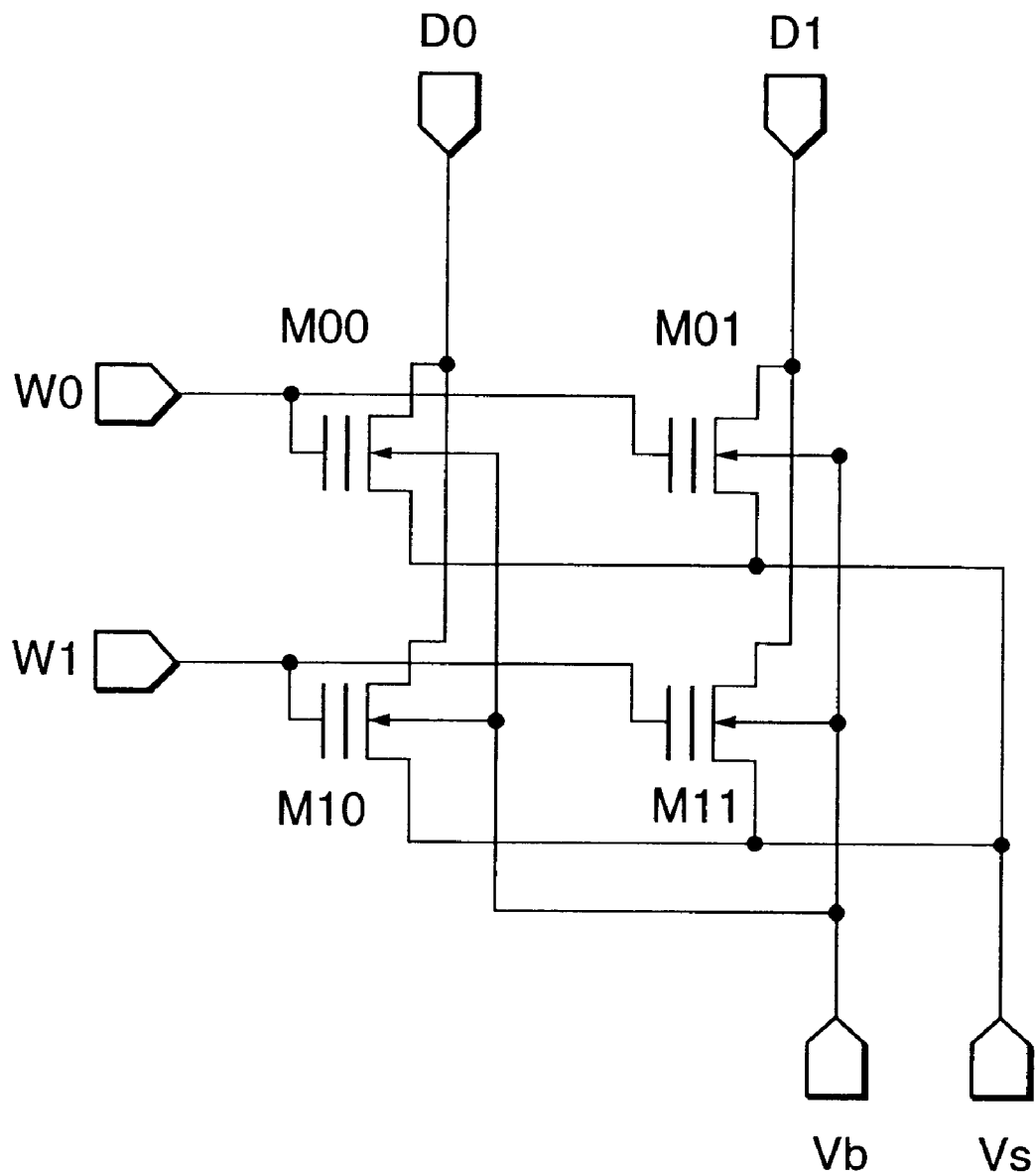
FIG. 11 is a circuit diagram showing a memory cell for a flash memory.

FIG. 1 is a circuit diagram showing an essential portion of a nonvolatile semiconductor memory device, according to one embodiment of the present invention, that comprises four memory cells, M00, M01, M10 and M11. A source voltage Vs and a substrate voltage Vb are used in common by these memory cells. The control gates of the memory cells M00 and M01 are connected in common to a row line W0, and the control gates of the memory cells M10 and M11 are connected in common to a row line W1. The drain electrodes of the memory cells M00 and M10 are connected in common to a column line D0, and the drain electrodes of the memory cells M01 and M11 are connected in common to a column line D1. In other words, the circuit structure of the memory cell is the same as the conventional structure shown in FIG. 11.

The nonvolatile semiconductor memory device according to the embodiment is a so-called flash memory, and information is stored in each memory cell in accordance with whether electrons are accumulated at the floating gate thereof. That is, when no electrons have accumulated at the floating gate, the threshold voltage, as viewed from the control gate, is low, and when electrons have accumulated at the floating gate, the threshold voltage, as viewed from the control gate, is high. This characteristic is employed to store information in a nonvolatile manner.

Next, an explanation will be given while referring to FIG. 16 for a voltage to be applied to each electrode when data reading, programming (data writing) and data erasing are to be performed for the memory cell M00 in FIG. 1, for example. The data reading and erasing processes are performed in the same manner as in the conventional art.

Specifically, to read data from the memory cell M00, as is shown in FIG. 16, the voltages set for the row lines W0 and W1 are 5 V and 0 V, respectively, and the voltage set for the column line D0 is 1 V, while the column line D1 is open. Further, the voltage set for both the source voltage Vs and the substrate voltage Vb is 0 V. And then, since a voltage of 5 V and a voltage of 1 V are respectively applied to the control gate and the drain of the memory cell M00, the memory cell transistor is rendered conductive when the threshold value of the memory cell M00 is low (equal to or lower than 5 V), or the memory cell transistor is rendered non-conductive when the threshold value is high (above 5 V). This conductive/non-conductive control is performed by a reading circuit (not shown) that detects the flow of a drain current.

When the substrate erasing method is employed to erase data, as is shown in FIG. 16 the voltage set for the row lines W0 and W1 is −10 V, the column lines D0 and D1 and the source voltage Vs are open, and the voltage set for the substrate voltage Vb is 1 V. Thus, since a voltage of −10 V and a voltage of 10 V are respectively applied to the control gate and the substrate of each memory cell, the electrons accumulated at the floating gate are discharged to the substrate, and not only are data in the memory cell M00 erased, but data in the other memory cells are erased at the same time. When the source-gate erasing method is employed, as is shown in FIG. 16, the voltage set for the row lines W0 and W1 is −10 V, the column lines D0 and D1 are open, and the voltage set for the source voltage Vs and the substrate voltage Vb is 10 V. Thus, since a voltage of −10 V and a voltage of 10 V are respectively applied to the control gate and the source of each memory cell, the electrons accumulated at the floating gate are discharged to the source, and data in all the memory cells are erased at the same time.

To program the memory cell M00, as is shown in FIG. 16, unlike the conventional art, the respective voltages set for the row line W0 and the row line W1 are 10.5 V and 0 V, the voltage set for the column line D0 is 6.5 V, and the column line D1 is open. Further, the voltage set for both the source voltage Vs and the substrate voltage Vb is 0.5 V. And thus, since a voltage of 10.5 V and a voltage of 6.5 V are respectively applied to the control gate and the drain of the memory cell M00, a hot carrier is injected into the floating gate of the memory cell M00, and its threshold voltage is increased as described above.

In this embodiment, it is important for both the source voltage Vs and the substrate voltage Vb to be set to a positive voltage (0.5 V).

Specifically, since the source voltage Vs is 0.5 V, even if the threshold voltage of the memory cell 10, which is not a programming target, is negative, in the programming process the gate-source voltage is −0.5 V. Thus, the probability is increased that the memory cell M10 will be rendered non-conductive, and the probability is better that the programming of the memory cell M00 will be performed correctly.

Further, if, since the substrate voltage Vb is 0.5 V, an optimal writing condition is that the control gate voltage, the source voltage and the drain voltage will be 10 V, 0 V and 6 V, respectively, with the substrate voltage as a reference, the control gate voltage, the source voltage and the drain voltage that are to be applied to the memory cell M00, which is the programming target, will satisfy this condition.

That is, although the voltages set for the control gate voltage, source voltage and the drain voltage to be applied to the programming target memory cell are higher by 0.5 V, while taking into account the presence of a memory cell whose threshold voltage has fallen and become negative, a voltage difference of 6 V between the drain diffusion layer and the substrate of the pertinent memory cell is maintained.

Therefore, for the nonvolatile semiconductor memory device of this embodiment, there is no deterioration of the programming characteristic, even when there is a memory cell whose threshold voltage has fallen to negative, and the ability to withstand a voltage, which is required of the drain diffusion layer, need not be increased beyond the level required for the conventional art.

Figure 12:
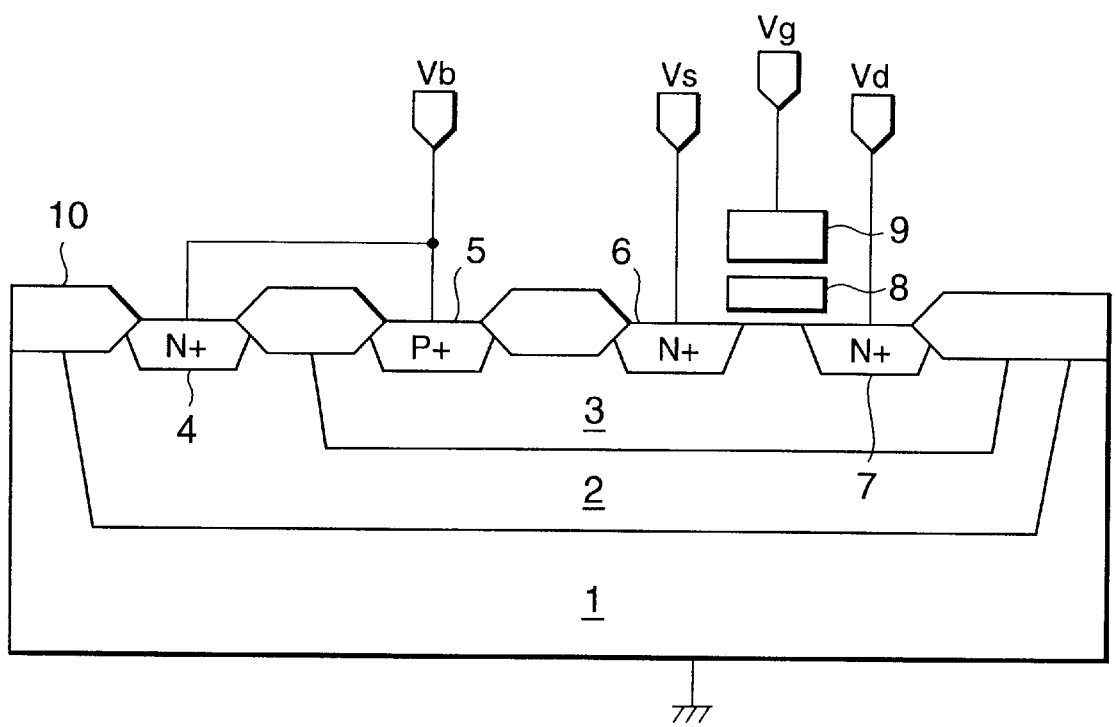
FIG. 12 is a diagram showing the device structure of memory cells of a flash memory that is appropriate for a substrate erasing method.
Figure 13:
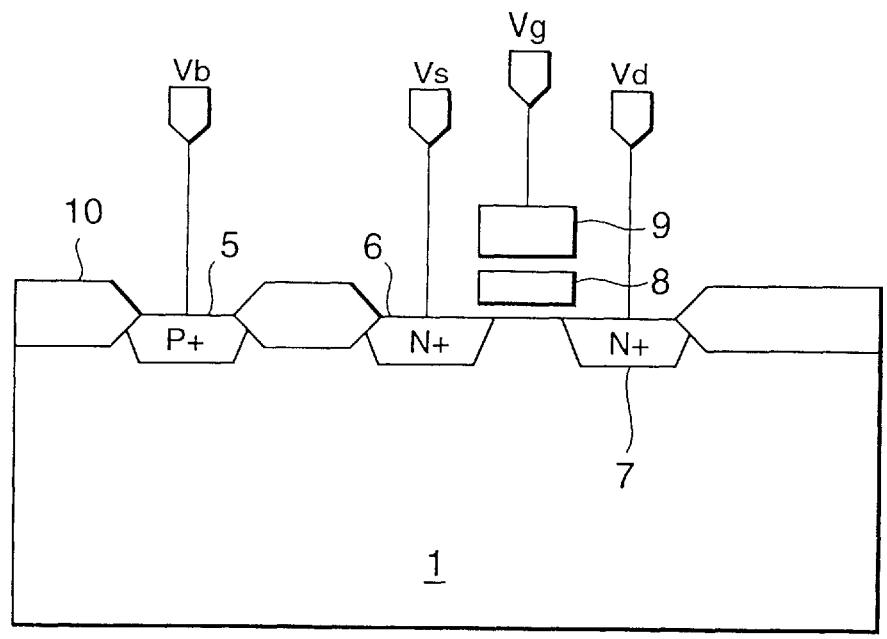
FIG. 13 is a diagram showing the device structure of memory cells of a flash memory that is appropriate for a source-gate erasing method.
Figure 14:
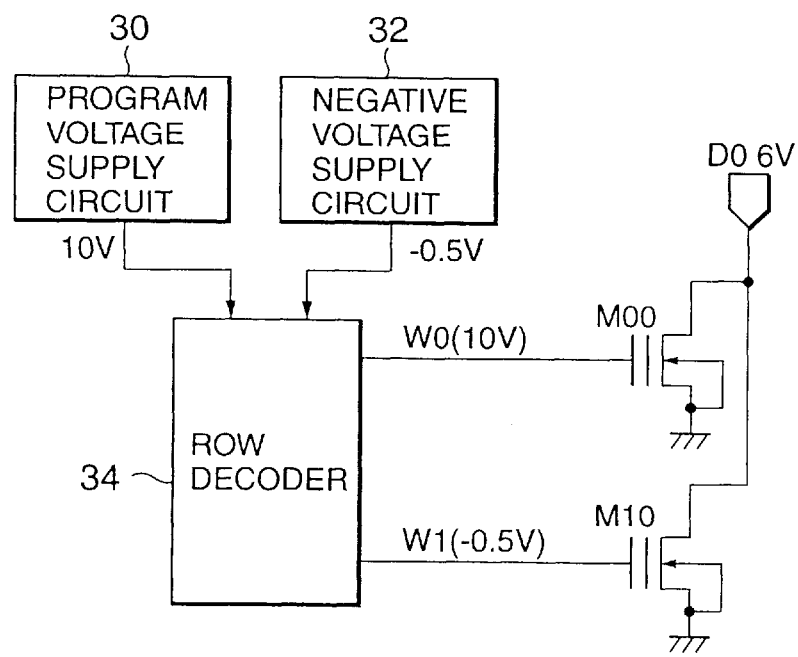
FIG. 14 is a diagram showing a first conventional example for preventing the deterioration of a programming characteristic.
Figure 15:
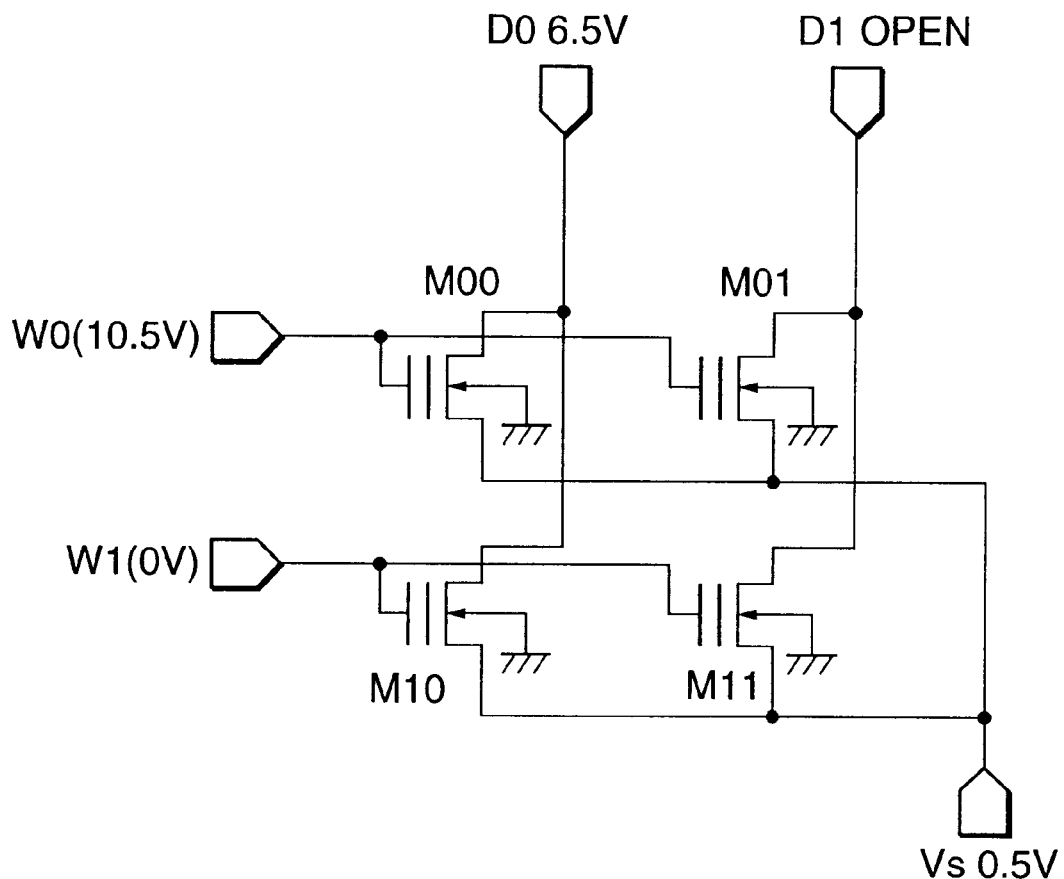
FIG. 15 is a diagram showing a second conventional example for preventing the deterioration of the programming characteristic.

Since in the programming process a positive voltage (0.5 V) is applied to the substrate of the nonvolatile semiconductor memory device of this embodiment, an appropriate structure for the substrate erasing method shown in FIG. 12 is required. This, however, does not inhibit the employment of the source-gate erasing method for the nonvolatile semiconductor memory device of this invention.

Further, the voltage to be applied to the substrate during the programming processing is not limited to 0.5 V; the only requirement is that the voltage be one that can reduce the difference between the drain diffusion layer and the substrate, which is caused by an increase in the drain voltage. The most preferable solution is that the voltage applied to the substrate be substantially equal to the increase (0.5 V in this embodiment) in the drain voltage.

The overall arrangement of the nonvolatile semiconductor memory device in this embodiment will now be described.

Figure 2:
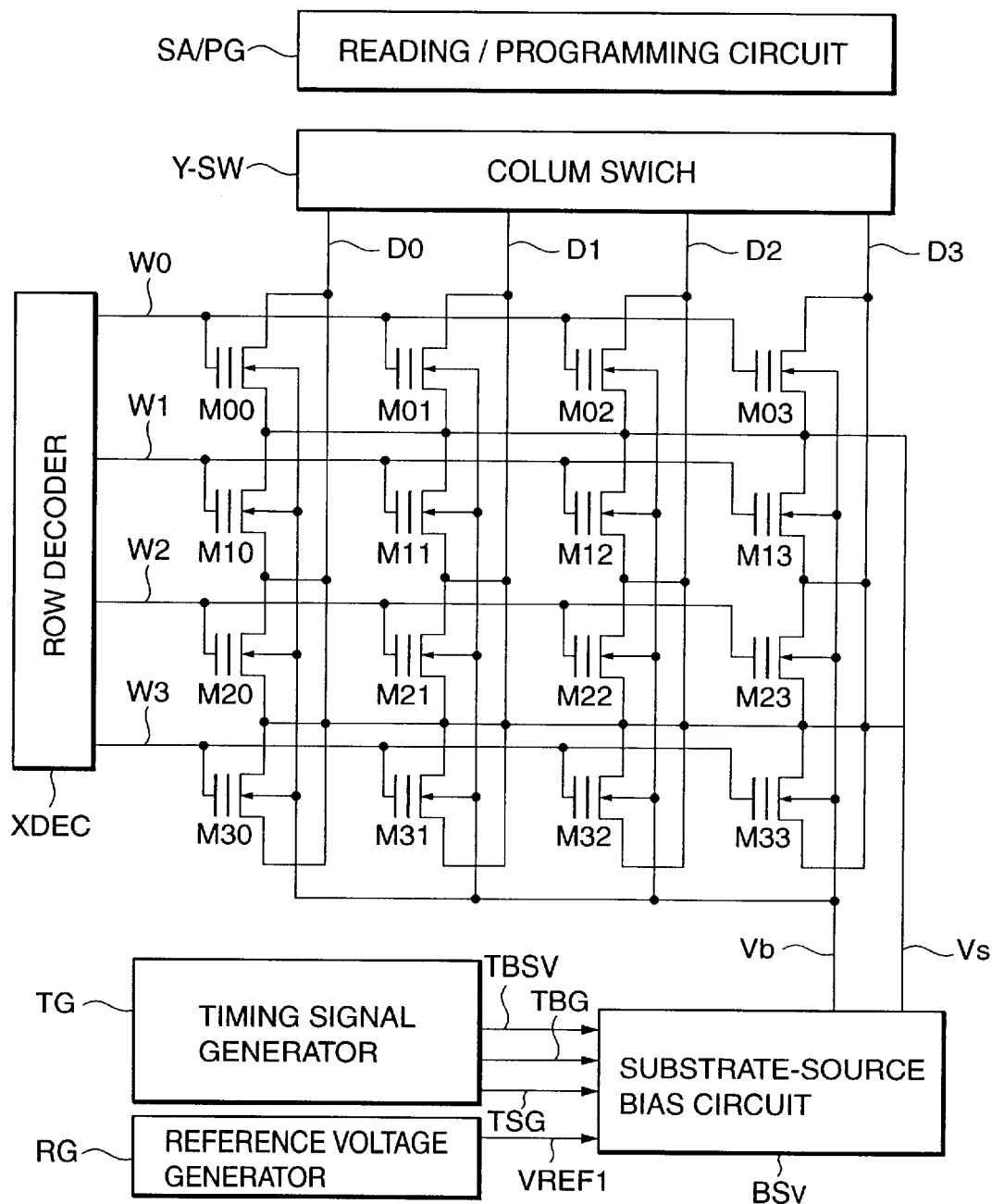
FIG. 2 is a schematic diagram showing the overall arrangement of the nonvolatile semiconductor memory device according to the embodiment of the present invention.

FIG. 2 is a schematic diagram illustrating the overall arrangement of the nonvolatile semiconductor memory device according to this embodiment. To simplify the drawing, only 16 memory cells are shown in FIG. 2, and the source voltage Vs and the substrate voltage Vb are used in common for these 16 memory cells. The control gates of the memory cells M00, M01, M02 and M03 are connected in common to the row line W0; the control gates of the memory cells M10, M11, M12 and M13 are connected in common to the row line W1; the control gates of the memory cells M20, M21, M22 and M23 are connected in common to the row line W2; and the control gates of the memory cells M30, M31, M32 and M33 are connected in common to the row line W3. The drain electrodes of the memory cells, M00, M01, M02 and M03 are connected in common to the column line D0; the drain electrodes of the memory cells M10, M11, M12 and M13 are connected in common to the column line D1; the drain electrodes of the memory cells M20, M21, M22 and M23 are connected in common to the column line D2; and the drain electrodes of the memory cells M30, M31, M32 and M33 are connected in common to the column line D3.

The row lines W0 to W3 are driven by a row decoder XDEC based on a row address signal that is externally supplied. As is described above, during the reading process, a selected row line is driven at a voltage of 5 V, and a non-selected row line is driven at a voltage of 0 V; in the programming process, a selected row line is driven at a voltage of 10.5 V, and a non-selected row line is driven at a voltage of 0 V; and in the erasing process, all the row lines are driven at a voltage of −10 V. It should be noted that these voltages are merely examples, and that the present invention is not limited to those given.

In accordance with a column address signal, which is externally supplied, one of the column lines D0 to D3 is connected via a column selection switch Y-SW to a reading/programming circuit SA/PG. While a specific circuit structure is not shown for the reading/programming circuit SA/PG, during the reading process, in order to detect the strength of a current that flows across the column line, this circuit applies a voltage of 1 V to the column line selected by the column selection switch Y-SW and thus detects the conductive state of the selected memory cell. During the programming process, the reading/programming circuit SA/PG applies a voltage of 6.5 V to the column line selected by the column selection switch Y-SW, and in order to increase the threshold voltage, injects a hot carrier into the floating gate of the selected memory cell. Once again, these voltages are merely examples, and the present invention is not limited to those given.

Figure 3:
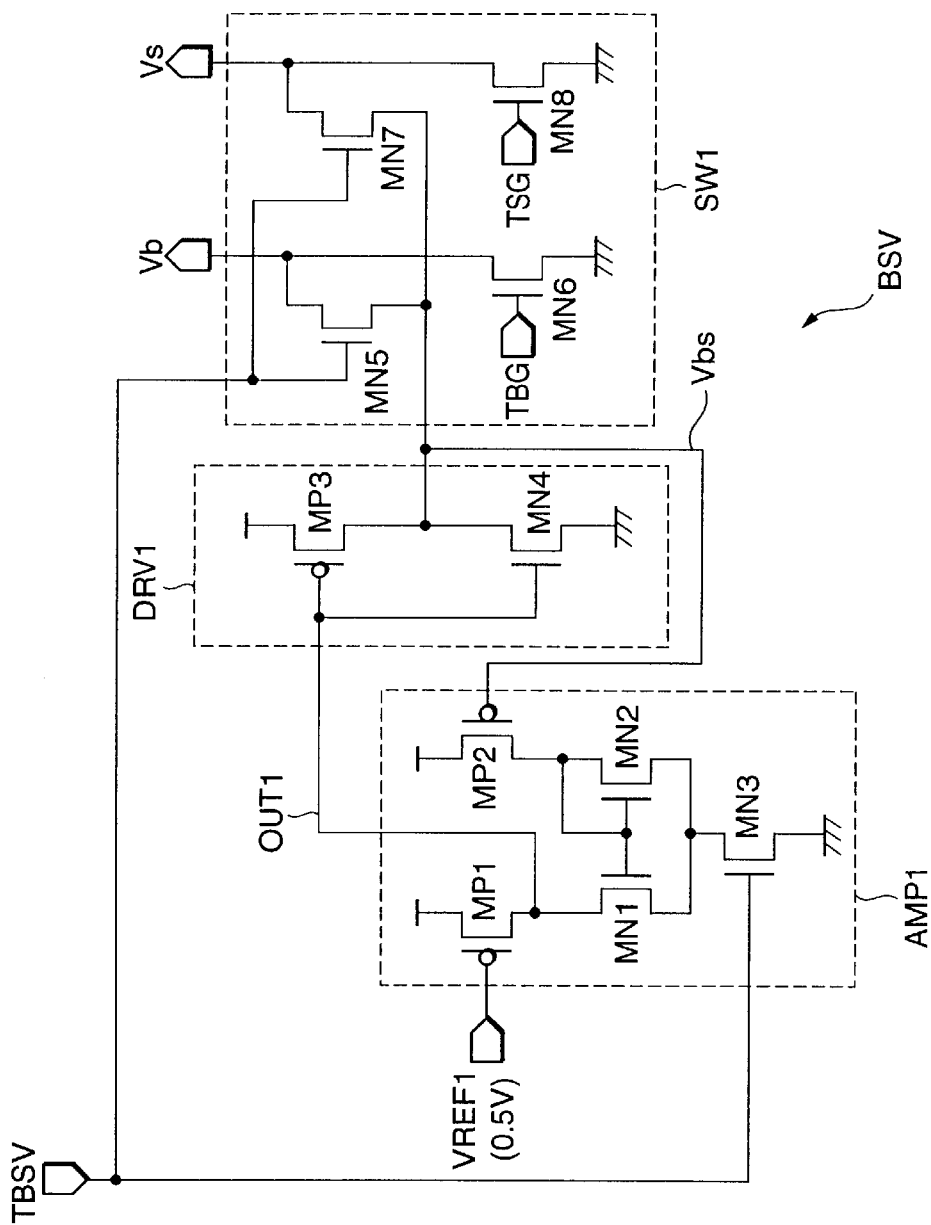
FIG. 3 is a circuit diagram showing an example substrate source bias circuit BSV in FIG. 2.

The source voltage Vs and the substrate voltage Vb are generated by a substrate-source bias circuit BSV. This substrate-source bias circuit BSV receives various timing signals from a timing signal generator TG and a reference voltage VREF from a reference voltage generator RG, and generates the source voltage Vs and the substrate voltage Vb. A specific circuit structure for this circuit BSV is shown in FIG. 3. The function of this circuit is as described above, and during the reading process, the source voltage Vs and the substrate voltage Vb are set to 0 V, while during the programming process, the source voltage Vs and the substrate voltage Vb are set to 0.5 V. In the substrate erasing method, the source voltage Vs is open, and the substrate voltage Vb is 10 V, and in the source-gate erasing method, the source voltage Vs is 10 V, and the substrate voltage Vb is 0 V. Also in this case, the present invention is not limited to these voltages.

The substrate-source bias circuit BSV will now be described while referring to FIG. 3.

As is shown in FIG. 3, the substrate-source bias circuit BSV includes a differential amplifier AMP1, a driving unit DRV1 and a switching unit SW1.

The differential amplifier AMP1 is activated when a control signal TBSV goes high. A reference voltage VREF1 is applied to a PMOS input transistor MPT1, which emits a drain voltage, output OUT1, and a substrate-source bias Vbs, which will be described later, is applied to a PMOS input transistor MP2. As is shown in FIG. 3, the differential amplifier AMP1 includes NMOS transistors MN1 to MN3. The reference voltage VREF1 is not specifically limited, and in this embodiment is 0.5 V.

The driving unit DRV1, which is an inverter and which includes a PMOS transistor MP3 and an NMOS transistor MN4, receives the output OUT1 from the differential amplifier AMP1 and outputs the substrate-source bias Vbs. As is apparent from the circuit structure in FIG. 3, the differential amplifier AMP1 and the driving unit DRV1 constitute a negative feedback circuit, and when the differential amplifier AMP1 is activated, the substrate-source bias Vbs is driven at substantially the same voltage as the reference voltage VREF1.

The switching unit SW1 generates the substrate voltage Vb, based on control signals TBSV and TBG, and generates the source voltage Vs, based on control signals TBSV and TSG. As is shown in FIG. 3, the switching unit SW1 consists of NMOS transistors MN5 to MN8.

Figure 4:
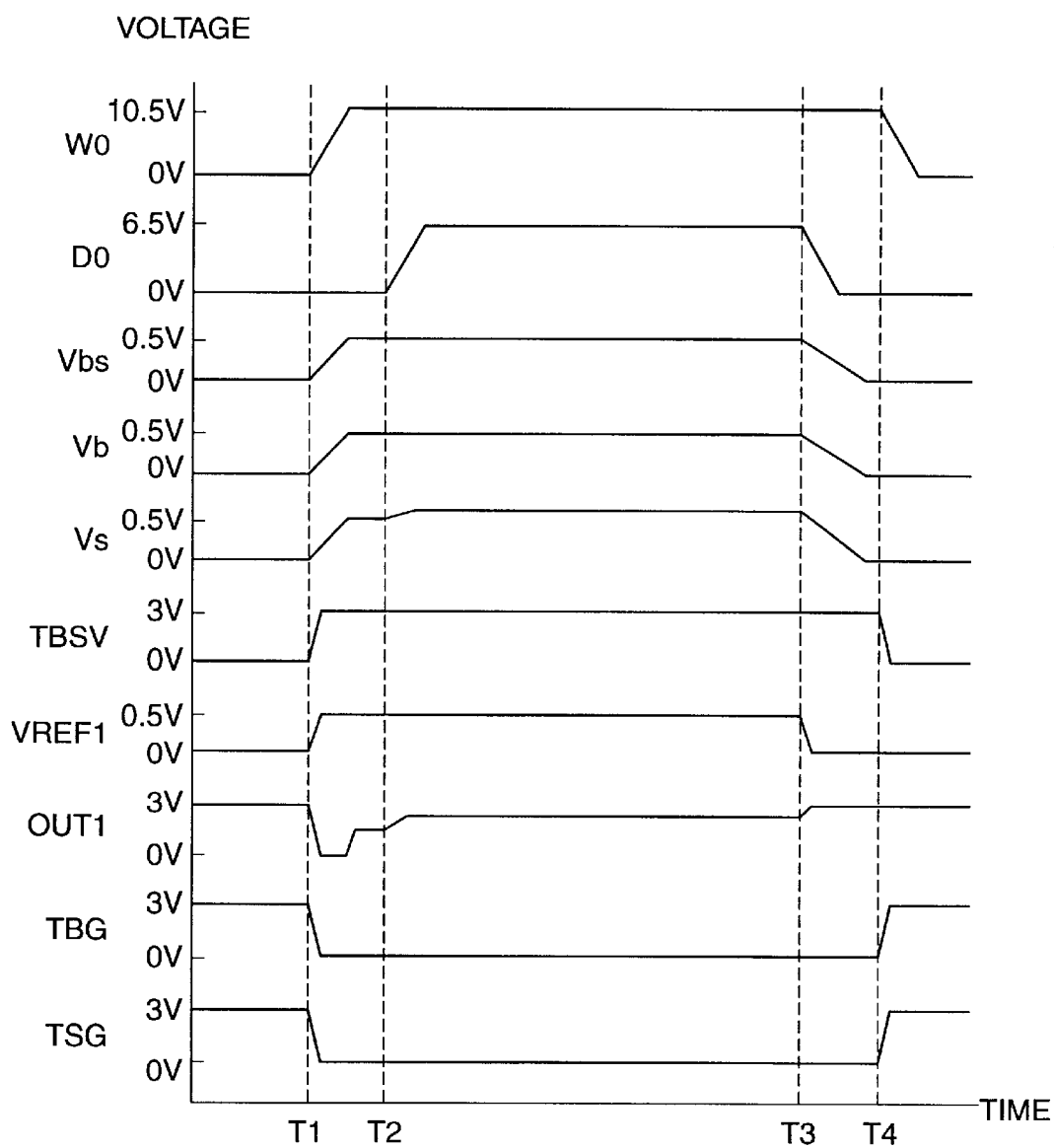
FIG. 4 is a timing chart showing the programming operation performed by a nonvolatile semiconductor memory device that employs the substrate source bias circuit BSV in FIG. 3.

FIG. 4 is a timing chart showing the programming operation performed by the nonvolatile semiconductor memory device using the thus structured substrate-source bias circuit BSV. An explanation will be given, while referring to FIG. 4, for the operation of the substrate-source bias circuit BSV during the programming process. Before time T1, the control signal TBSV is low, the differential amplifier AMP1 is not activated, the reference voltage VREF1 is 0 V, the output OUT1 is high (3 V), and the substrate source bias Vbs is low (0 V). The control signals TBG and TSG are both high (3 V), so that the substrate voltage Vb and the source voltage Vs are 0 V. As is described above, these voltages are applied to the substrate and the to sources of the memory cells M00 to M33.

At time T2, the row line (row line W0 in this case) selected by the row decoder XDEC is activated at a voltage of 10.5 V. At the same time, the reference voltage VREF1 is raised to 0.5 V, the control signal TBSV goes high (3 V), and the control signals TBG and TSG go low (0 V). Thus, the differential amplifier AMP1 is activated, and the substrate-source bias Vbs is driven substantially at the same voltage (0.5 V) as the reference voltage VREF1. Since the control signals TBS and TSG are dropped to low (0 V), the NMOS transistors MN6 and MN8 are rendered non-conductive, and since the control signal TBSV goes high (4 V), the NMOS transistors MN5 and MN7 are rendered conductive. Therefore, the substrate voltage Vb and the source voltage Vs are changed and supply the same voltage as the substrate-source bias Vbs, i.e., 0.5 V.

Although not shown in FIG. 4, the row lines other than the selected row line W0, W1 to W3, are still 0 V.

At time T2, a column line (column line D0 in this case) selected by the column selection switch Y-SW is driven at 6.5 V by the reading/programming circuit SA/PG, while the other column lines, D1 to D3, are open. Thus, a programming current flows across the memory cell M00, and a hot carrier is injected into the floating gate. In other words, the programming period starts at time T2.

Since the programming current is transmitted by the source diffusion layer to the substrate-source bias circuit BSV, the source voltage Vs is increased slightly, as is shown in FIG. 4. The difference in the voltage between the source voltage Vs and the substrate-source bias Vbs is absorbed by the resistor of the NMOS transistor MN7, which is currently conductive.

At time T3, the column line D0, which is driven at 6.5 V, is returned to the 0 V level and the programming period is terminated. At the same time, the reference voltage VREF1 is dropped to 0 V, and the substrate-source bias Vbs is also returned to 0 V. Accordingly, the substrate voltage Vb and the source voltage Vs are also dropped to 0 V.

At time T3, the selected row line W0 is deactivated (0 V), and also the control signals TBSV is dropped to low (0 V), while the control signals TBS and TSG go to high (3 V). The substrate-source bias circuit BSV is returned to the state before time T1, and a series of the programming operation is thus terminated.

As is described above, the period from T2 to T3 is the substantial programming period, and during this period, a voltage of 10.5 V is applied to the control gate of the memory cell M00 that is to be programmed, a voltage of 6.5 V is applied to the drain diffusion layer, and a voltage of 0.5 V is applied to the source diffusion layer and the substrate. Thus, if the optimal writing condition is that the control gate voltage, the source voltage and the drain voltage are respectively 10 V, 0 V and 6 V, with the substrate voltage serving as a reference, the control gate voltage, the source voltage and the drain voltage for the memory cell M00 that is a programming target satisfy this condition, so that desired programming can be performed, and that the voltage applied to the drain diffusion layer and the substrate can be reduced to 6 V.

Further, since the source voltage Vs is 0.5 V during the programming period, the gate-source voltage in the programming process is −0.5 V, even when the threshold voltage of the memory cell M10 that is not a programming target is negative. Thus, the probability that the memory cell M10 will be rendered non-conductive and that the programming of the memory cell M00 will be successful is increased.

As is described above, according to the nonvolatile semiconductor memory device and the programming method therefor in this embodiment, not only can an increase in the circuit size and in the programming time be suppressed, but also the voltage applied to the diffusion layer and the substrate can be reduced, so that the ability to withstand a voltage, which is required of the drain diffusion layer, need not be increased.

Figure 5:
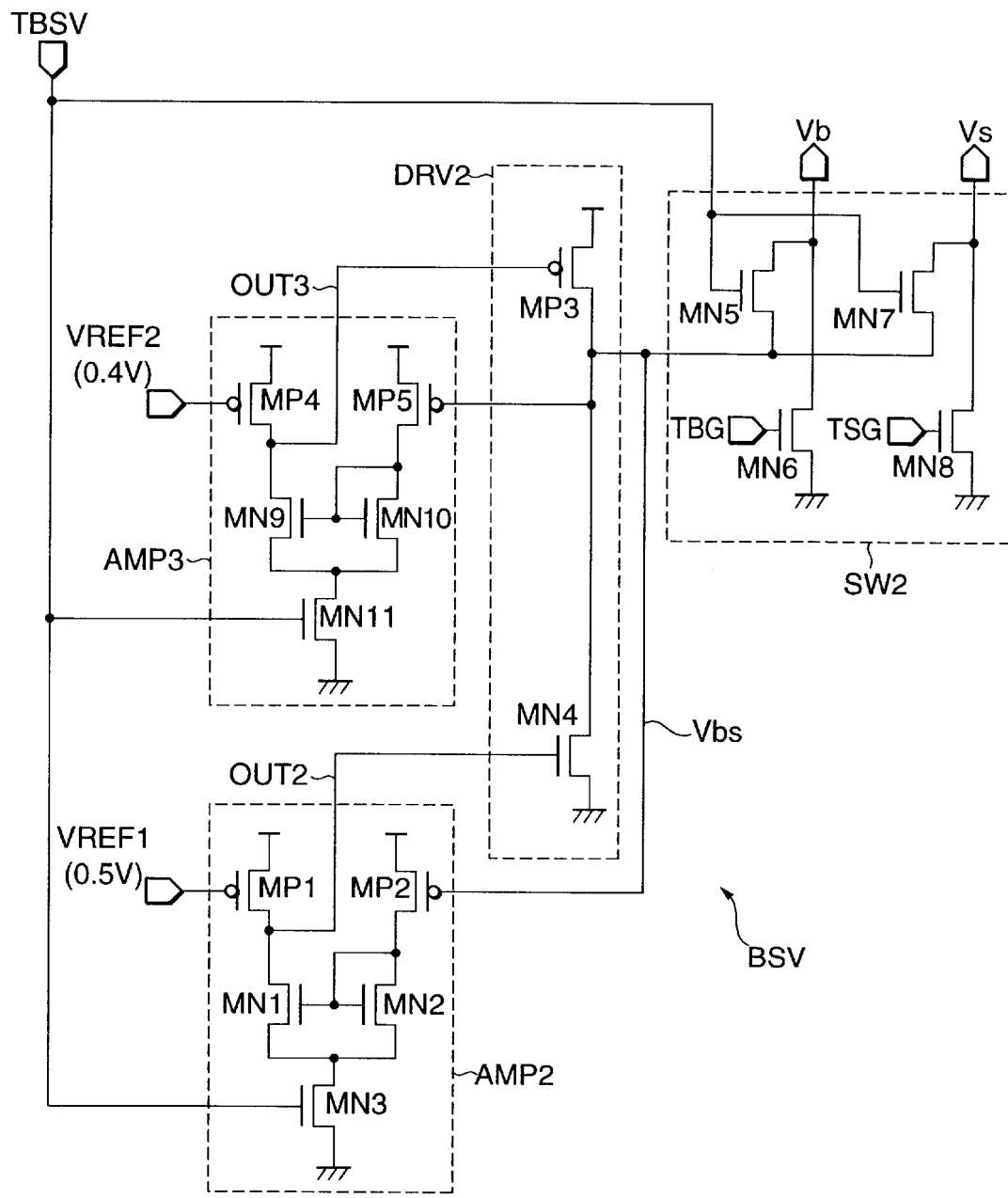
FIG. 5 is a circuit diagram showing another example substrate source bias circuit BSV in FIG. 2.

Further, the substrate-source bias circuit BSV circuit shown in FIG. 3 may be replaced with a substrate-source bias circuit BSV circuit shown in FIG. 5.

The substrate-source bias circuit BSV in FIG. 5 includes two differential amplifiers AMP2 and AMP3. The NMOS transistor MN4 that constitutes the driving unit DRV2 is controlled by the output OUT2 of the differential amplifier AMP2, and the PMOS transistor AMP3 is controlled by the output OUT3 of the differential amplifier AMP3. As is shown in FIG. 5, the differential amplifier AMP2 receives the reference voltage 10 VREF1 of 0.5 V, and the differential amplifier AMP3 receives the reference voltage VREF2 of 0.4 V. Therefore, when the substrate-source bias Vbs voltage falls until it is equal to or lower than 0.4 V, the PMOS transistor MP3 that constitutes the driving unit DRV2 is rendered conductive and increases the voltage; and when the substrate-source bias Vbs voltage is raised until it is equal to or higher than 0.5 V, the NMOS transistor MN4 is rendered conductive and reduces the voltage.

Figure 6:
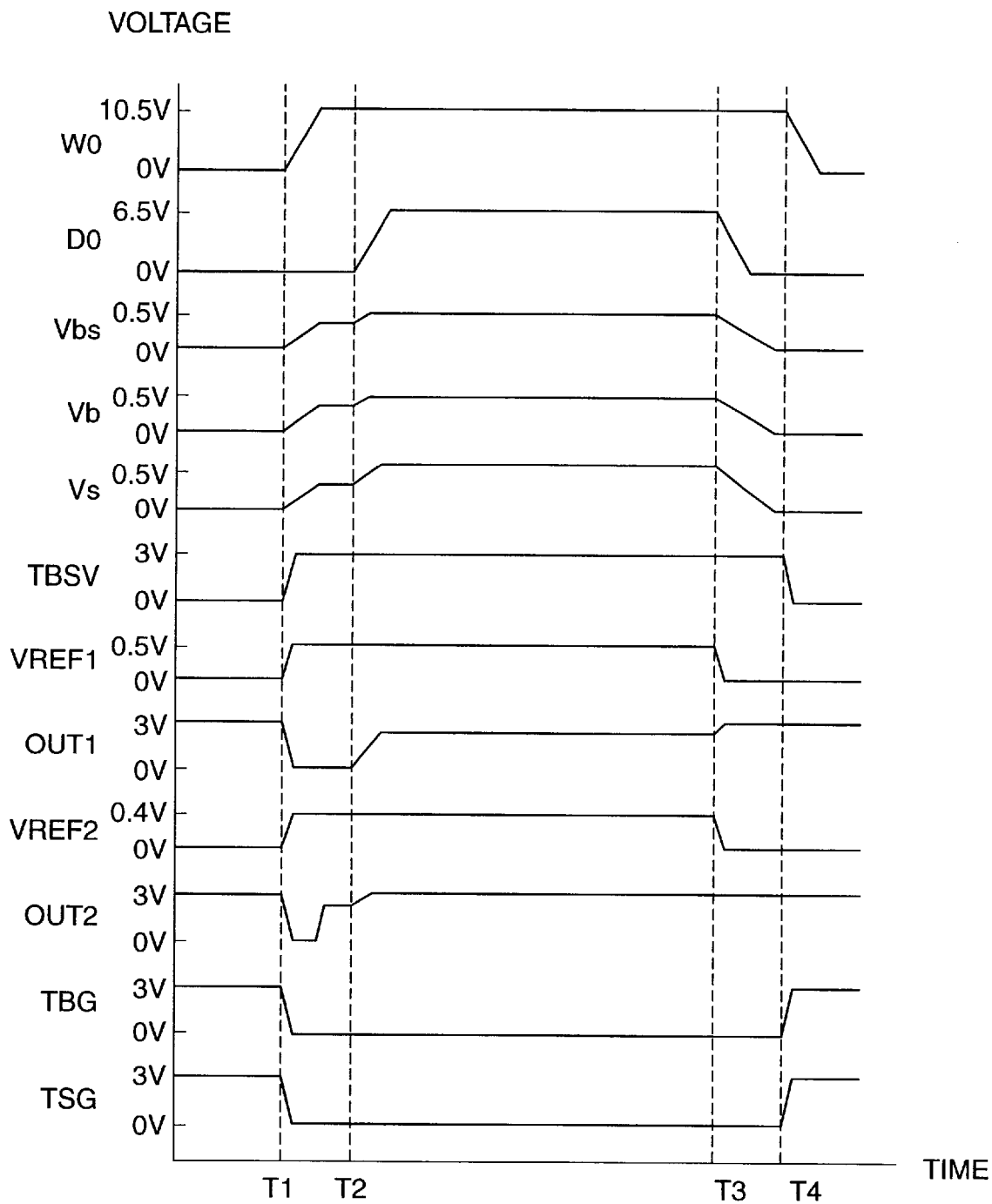
FIG. 6 is a timing chart showing the programming operation performed by a nonvolatile semiconductor memory device that employs the substrate source bias circuit BSV in FIG. 5.

FIG. 6 is a timing chart showing the programming operation for the nonvolatile semiconductor memory device having the thus 20 structured substrate-source bias circuit BSV. As is apparent from the timing chart in FIG. 6, the timing at which the reference voltage VREF and the voltages of the row line W0, the column line D0 and various control lines are changed is the same as is shown in FIG. 4, and that the timing at which the substrate voltage Vb and the source voltage Vs and the voltage of the substrate-source bias Vbs are changed differs from that in FIG. 4.

That is, as is described above, since the voltage of the substrate-source bias Vbs does not exceed 0.4 V, depending on how the driving unit DRV2 is driven, the voltage of 0.4 V is maintained during the period extending from time T1 to time T2. Then, at time T2 the voltage is increased because a current is introduced along the column line D0. However, as is described above, since the NMOS transistor MN4 is rendered conductive when the substrate-source bias Vbs exceeds 0.5 V, the voltage of the substrate-source bias Vbs is maintained at 0.5 V.

The advantages accruing from the employment of the substrate-source bias circuit BSV in FIG. 5 are as follows. The substrate-source bias circuit BSV in FIG. 5 functions the same as that in FIG. 3 in that the substrate voltage Vb and the source voltage Vs are set to 0.5 V during the programming period (from time T2 to time T3). However, since the PMOS transistor MP3 and the NMOS transistor MN4 that constitute the driving unit DRV2 are not rendered conductive at the same time, a feedthrough current does not occur, and thus, when compared with the substrate-source bias circuit BSV in FIG. 3, the power consumption can be reduced.

An explanation will now be given for a nonvolatile semiconductor memory device and a programming method therefor according to another embodiment of the present invention. This embodiment is applied for a nonvolatile semiconductor memory device wherein a memory cell array is divided into a plurality of sectors and the erasing of data in individual sectors can be performed. The memory cell array is divided into a plurality of sectors because the source capacitor and the substrate capacitor of the memory cell are divided to enable them to be driven rapidly at low power. Further, since when a memory cell array has been divided into sectors the erasing of data in individual sectors can be performed, improved usability is also provided for users.

Figure 7:
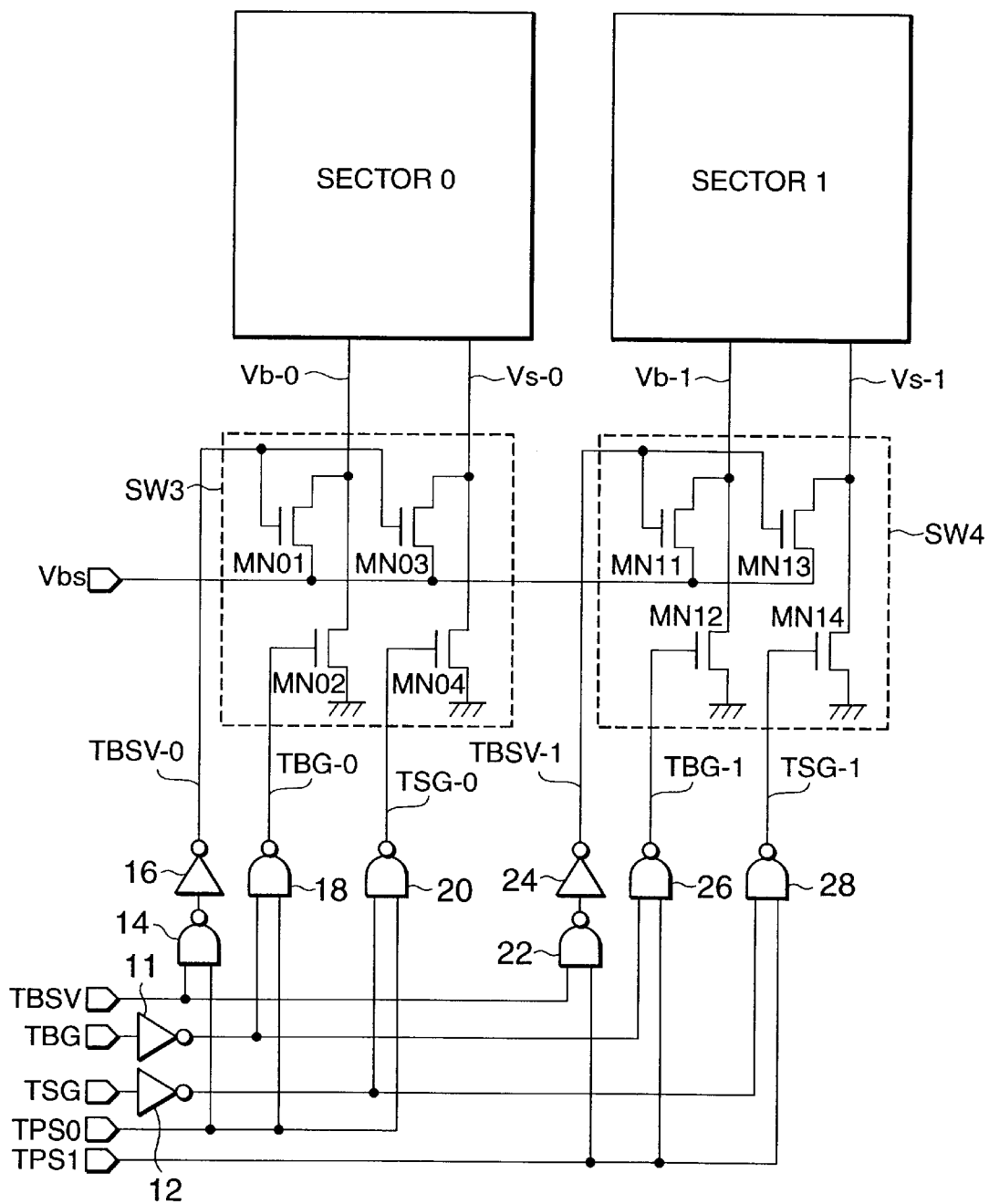
FIG. 7 is a schematic diagram showing the overall arrangement of a nonvolatile semiconductor memory device according to another embodiment of the present invention.

FIG. 7 is a diagram showing a nonvolatile semiconductor memory device according to this embodiment that includes two memory cell arrays, a sector 0 and a sector 1. As is shown in FIG. 7, substrate voltages Vb-0 and Vb-1, and source voltages Vs-0 and Vs-1 are respectively supplied to the sectors 0 and 1.

Figure 8:
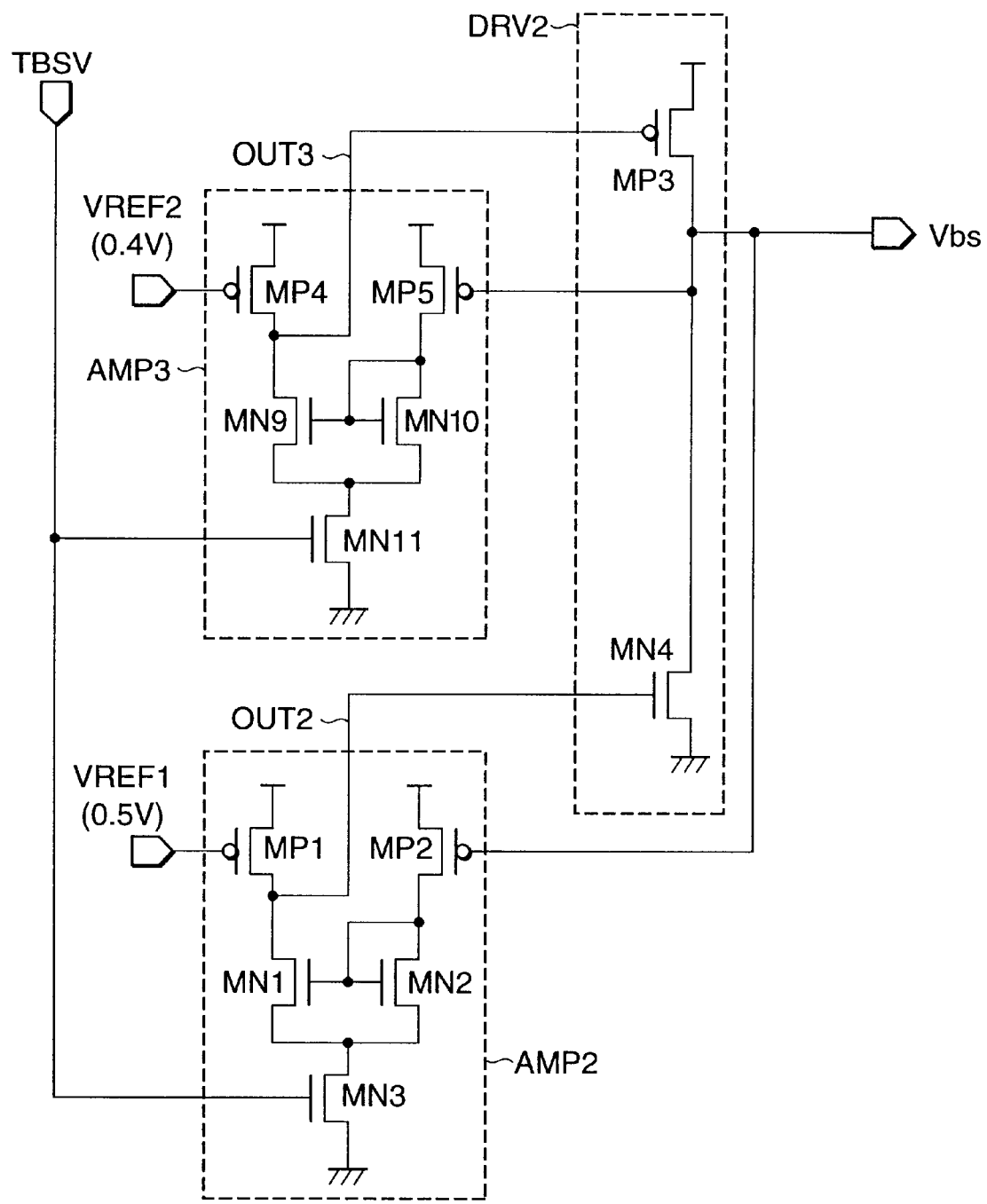
FIG. 8 is a circuit diagram showing a substrate source bias generation circuit that is used for the nonvolatile semiconductor memory device in FIG. 7.

A switching unit SW3 supplies the substrate voltage Vb-0 and the source voltage Vs-0 to the sector 0, and a switching unit SW4 supplies the substrate voltage Vb-1 and the source voltage Vs-1 to the sector 1. These voltages are generated by a substrate-source bias generator in FIG. 8. Since the substrate-source bias generator in FIG. 8 is constituted by the differential amplifiers AMP2 and AMP3 and the driving unit DRV2 included in the substrate-source bias circuit BV in FIG. 5, no explanation of their functions will be given. It should be noted, however, that the substrate-source bias generator is not limited to the structure shown, but that the differential amplifier AMP1 and the driving unit DRV1 in the substrate-source bias circuit BSV in FIG. 3, for example, may be employed to constitute the substrate-source bias generator. Furthermore, a plurality of substrate-source bias generators may be provided for the individual switching units SW3 and SW4.

The functions of the switching units SW3 and SW4 are the same as those of the switching units SW1 and SW2, except for the supply of the control signals to the gates of the individual transistors constituting the switching units SW3 and SW4.

Specifically, to select a sector to be activated, selection signals TPS0 and TPS1 are transmitted to the nonvolatile semiconductor memory device in FIG. 7. When the selection signal TPS0 is active (high) and the selection signal TPS1 is inactive (low), control signals TBSV-0, TBG-0 and TSG-0 to be transmitted to the switching unit SW3 are logically the same as the control signals TBSV, TBG and TSG, and the functions of the switching unit SW3 are the same as those of the switching units SW1 and SW2. Control signals TBSV-1, TBG-1 and TSG-1 that are to be transmitted to the switching unit SW4 are respectively set low, high and high, regardless of the logic of the control signals TBSV, TBG and TSG. Therefore, the substrate voltage Vb-1 and the source voltage Vs-1 are forcibly fixed at 0 V.

When the selection signal TPS1 is active (high) and the selection signal TPS0 is inactive (low), the control signals TBSV-1, TBG-1 and TSG-1 that are to be transmitted to the switching unit SW4 are logically the same as the control signals TBSV, TBG and TSG, and the functions of the switching unit SW4 are the same as those of the switching units SW1 and SW2. The control signals TBSV-0, TBG-0 and TSG-0 that are to be transmitted to the switching unit SW3 are respectively set low, high and high, regardless of the logic of the control signals TBSV, TBG and TSG. Therefore, the substrate voltage Vb-0 and the source voltage Vs-0 are forcibly fixed at 0 V.

Since, as described above, in accordance with the selection signals TPS0 and TPS1 a desired source voltage Vs and a desired substrate voltage Vb can be applied to only one of the sectors, the source capacitor and the substrate capacitor of the memory cell can be driven rapidly at low power, and the data in each sector can be erased. The nonvolatile semiconductor memory device in this embodiment, as well as the one in the previous embodiment, provides the advantages that the deterioration of the programming characteristic can be prevented while at the same time suppressing an increase in the circuit size and in the need for the ability to withstand a voltage, which is required for the drain diffusion layer.

In this embodiment, two separate sectors are employed; however, the present invention is not limited to this arrangement, and three or more separate sectors maybe employed.

An explanation will now be given for a nonvolatile semiconductor memory device and a programming method therefor in accordance with an additional embodiment of the present invention.

In this embodiment, as in the preceding one, the present invention is applied to a nonvolatile semiconductor memory device wherein a memory cell array is divided into a plurality of sectors, and the erasing of data in individual sectors can be performed. This device differs from the nonvolatile semiconductor memory device in FIG. 7 in that the switching units SW3 and SW4 are respectively replaced by switching units SW5 and SW6, and in that a substrate-source bias generator in FIG. 10 is employed.

The switching unit SW5, or SW6, can be fabricated by adding either an NM03 or an MN13m NMOS transistor to the switching unit SW3, or SW4. The switching unit SW5, or SW6, is rendered conductive in accordance with the control signal TBSV-0, or TBSV-1, and the source voltage VS-0, or VS-1, can be extracted as a monitor signal Vsm. Thereafter, the monitor signal Vsm is transmitted to the substrate-spruce bias generator in FIG. 10.

Figure 10:
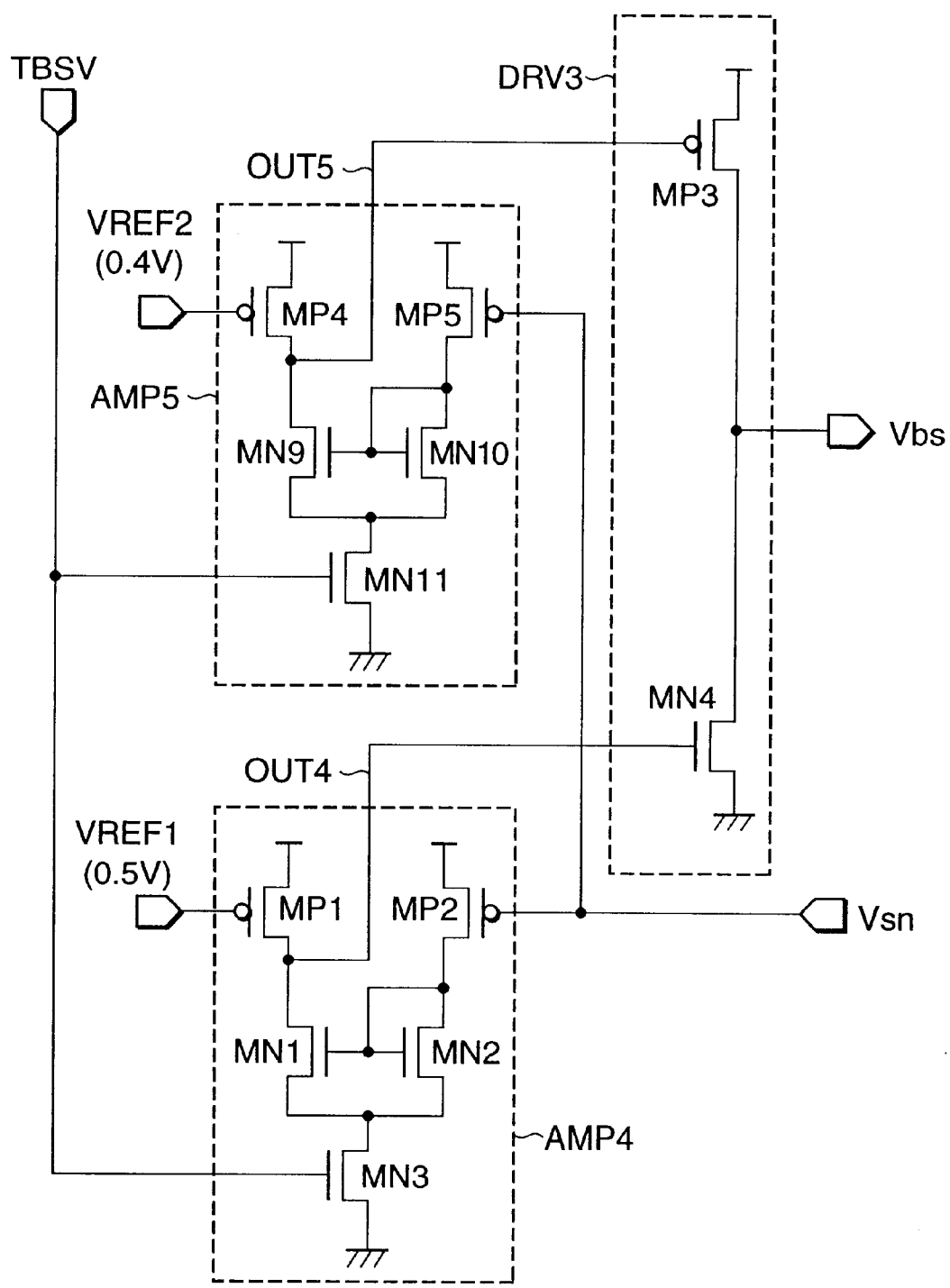
FIG. 10 is a circuit diagram showing a substrate source bias generation circuit that is used for the nonvolatile semiconductor memory device in FIG. 9.

The substrate-source bias generator in FIG. 10 includes differential amplifiers AMP4 and AMP5 and a driving unit DRV3, and the monitor signal Vsm is received by input transistors MP2 and MP5 included in the differential amplifiers AMP4 and AMP5.

The nonvolatile semiconductor memory device in this embodiment provides the same effects as are provided by the memory device in FIGS. 7 and 8, and during the programming process can be used to more precisely adjust the substrate voltage Vb and the source voltage Vs.

Specifically, when the substrate-source bias Vbs is employed in common by a plurality of sectors, as in the nonvolatile semiconductor memory device in this embodiment, the substrate-source bias line is extended, and the resistance differs for each sector. In the example in FIG. 9, the resistance along the line between the substrate-source bias generator and the switching unit SW5 is R1, and the resistance along the line between the substrate-source bias generator and the switching unit SW6 is R1+R2, wherein R1 is 10□ and R2 is 40□. Furthermore, when during the programming process a current that flows into the source is defined as 300 VA, and 16 memory cells are to be programmed at one time, the current flowing to the substrate-source bias Vbs is 300□A×16=4.8 mA.

Therefore, assuming that the substrate-source bias Vbs on the periphery of the substrate-source bias generator is a constant 0.5 V, the substrate-source bias Vbs near the sector 0 that is to be programmed is 0.5 V+(4.8 mA×10□)=0.548 V, while taking into account the voltage drop due to the resistor R1 (10□). On the other hand, the substrate-source bias Vbs near the sector 1 to be programmed is 0.5 V+(4.8 mA×50□)=0.74 V, while taking into account the voltage drop due to the resistors R1 (10□) and R2 (50□). Thus, a difference in the actual substrate voltage Vb and the source voltage Vs is generated between the sector 0 and the sector 1. This voltage difference is becomes more marked as the line resistance of the substrate-source bias Vbs rises, and causes the programming characteristics of the sectors to vary.

Figure 9:
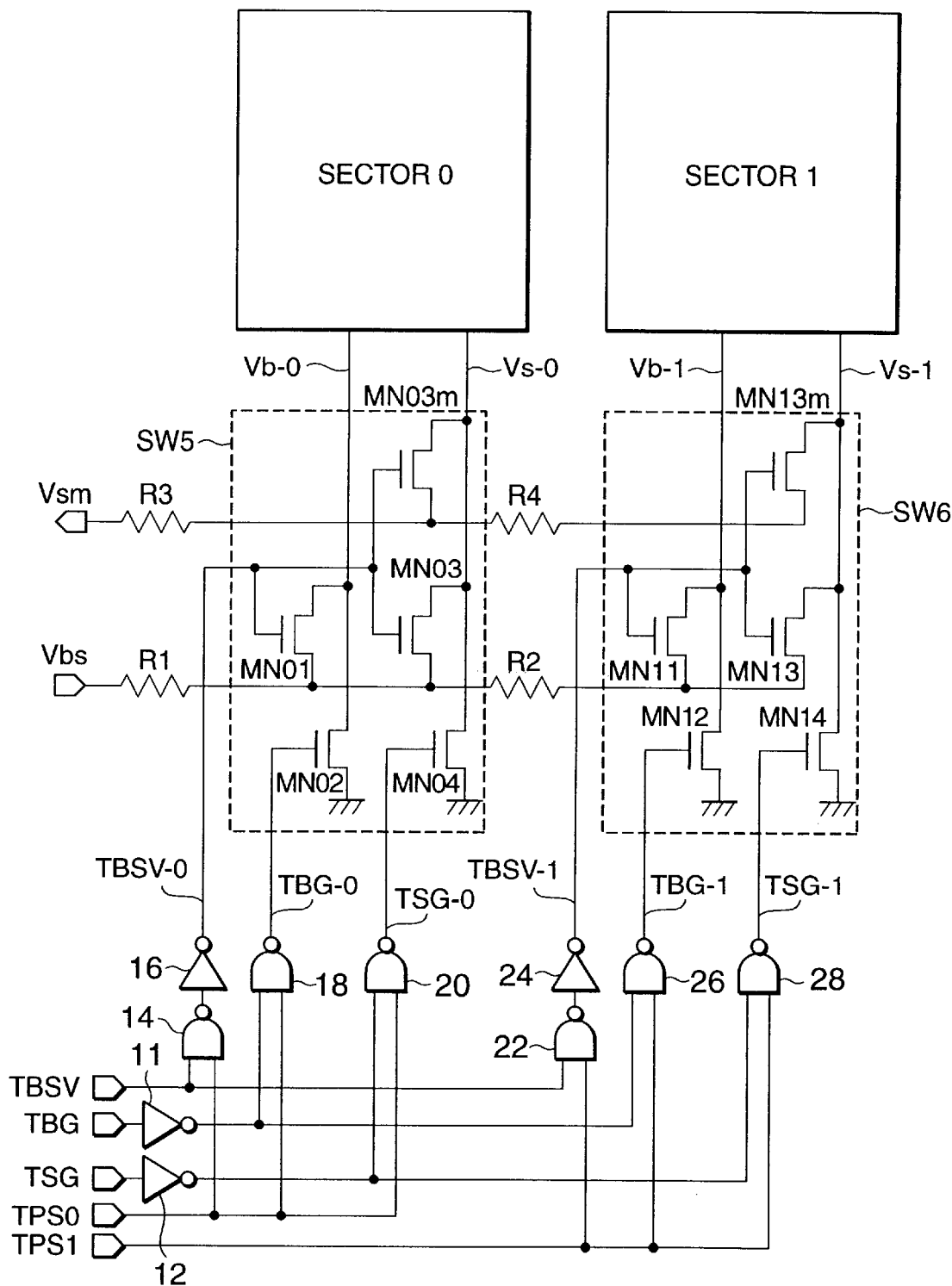
FIG. 9 is a schematic diagram showing the overall arrangement of a nonvolatile semiconductor memory device according to an additional embodiment of the present invention.

However, according to the nonvolatile semiconductor memory device in this embodiment, as is shown in FIGS. 9 and 10, the actual source voltage Vs is monitored using the monitor signal Vsm, and the substrate-source bias Vbs is generated based on the source voltage Vs. Thus, a desired source voltage Vs and a desired substrate voltage Vb, i.e., 0.5 V, can be set for each sector.

Although resistors R3 and R4 are disposed along the line for the monitor signal Vsm and almost no current flows along it, this signal line is used to monitor voltage. As a result, while the voltage can be precisely monitored, there is no substantial voltage drop.

In FIG. 9, the monitor signal Vsm is a voltage obtained by monitoring the source voltage Vs; however, the monitor signal Vsm may instead be a voltage obtained by monitoring the substrate voltage Vb.

As is described above, according to the present invention there is no programming characteristic deterioration, even when a memory cell is present whose threshold voltage has dropped and is negative, and the ability to withstand a voltage, which is required of the drain diffusion layer, need not be increased until it is greater than the level required for the conventional art.

According to the present invention, therefore, the reliability of the nonvolatile semiconductor memory device can be enhanced.

What is claimed is:

1. A nonvolatile semiconductor memory device comprising:
    a first memory cell; and
    a voltage supply circuit which produces a source voltage to be supplied to a source of said memory cell, a drain voltage to be supplied to a drain of said memory cell and a substrate voltage during a programming period, each of said source, drain and substrate voltages being a positive voltage and said drain voltage being higher than said source voltage.

2. The device as claimed in claim 1, said device further comprising a second memory cell, which is not a programming target, having a gate supplied with a ground voltage during said programming period.

3. The memory device as claimed in claim 1, wherein said voltage supply circuit produces a gate voltage being a positive voltage to be supplied with a control gate of said memory cell.

4. A nonvolatile semiconductor memory device, which includes at the least, first and second memory cells, comprising:
    a row decoder which applies a first voltage to a control gate of said first memory cell and a ground voltage to a control gate of said second memory cell in accordance with an address signal;
    a programming circuit which applies a program voltage to the drains of said first and said second memory cells; and
    a substrate source bias circuit which applies a second voltage to sources of said first and said second memory cells, and applies a third voltage to the substrates of said first and said second memory cells,
    wherein each of said second and said third voltages has a voltage level between said first voltage and said ground voltage.

5. The device as claimed in claim 4, wherein said second voltage is substantially equal to said third voltage.

6. The memory device as claimed in claim 4, wherein said first voltage is a positive voltage.

7. A nonvolatile semiconductor memory device comprising:
    a plurality of row lines;
    a row decoder for activating a row line in accordance with a row address signal;
    a plurality of column lines;
    a reading/programming circuit for applying one of a read voltage and a program voltage to a column line in accordance with a column address signal;

a plurality of nonvolatile memory cells, the control gates of which are respectively connected to said row lines, and the drains of which are respectively connected to said column lines; and a substrate source bias circuit which applies a source voltage and a substrate voltage to said plurality of nonvolatile memory cells, wherein, said substrate source bias circuit sets said source voltage and said substrate voltage to a ground voltage during a reading period, and said substrate source bias circuit sets said source voltage and said substrate voltage to a positive voltage during a programming period.

8. The device as claimed in claim 7, wherein said substrate source bias circuit includes:

an amplifier comparing a substrate source bias voltage with a reference voltage, and generating an output signal based on the comparison results during said programming period;

a driving unit generating said substrate source bias voltage in accordance with said output signal; and a switching unit supplying said source bias voltage as a source voltage and a substrate voltage in common to said plurality of nonvolatile memory cells.

9. The device as claimed in claim 7, wherein said substrate source bias circuit includes:

a first amplifier, during said programming period, at the least comparing a substrate source bias voltage with a first reference voltage, and generating a first output signal based on the comparison results;

a second amplifier, during said programming period, at the least comparing said substrate source bias voltage with a second reference voltage, and generating a second output signal based on the comparison results;

a driving unit generating said substrate source bias voltage in accordance with said first and second output signals; and a switching unit, during said programming period, at the least supplying in common said source bias voltage as a source voltage and a substrate voltage to said plurality of nonvolatile memory cells.

10. The device as claimed in claim 9, wherein said driving unit includes:

a first circuit receiving said first output signal, and reducing said substrate source bias voltage in accordance with said first output signal; and a second circuit receiving said second output signal and for raising said substrate source bias voltage in accordance with said second output signal.

11. The device as claimed in claim 7, wherein said substrate source bias circuit includes:

a first amplifier, during said programming period, at the least comparing said source voltage or said substrate voltage with a first reference voltage, and generating a first output signal based on the comparison results;

a second amplifier, at least in said programming period, comparing said source voltage or said substrate voltage with a second reference voltage, and generating a second output signal based on the comparison results;

a driving unit generating a source bias voltage in accordance with said first and said second output signals; and a switching unit, during said programming period, at the least supplying in common a source bias voltage as a source voltage and as a substrate voltage to said plurality of nonvolatile memory cells.

12. A device as claimed in claim 7, wherein said substrate source bias circuit includes:

a first comparator, during said programming period, at the least comparing a substrate source bias voltage with a first reference voltage, and reducing said substrate source bias voltage when said substrate source bias voltage is higher than said first reference voltage;

a second comparator, during said programming period, at the least comparing said substrate source bias voltage with a second reference voltage that is lower than said first reference voltage, and increasing said substrate source bias voltage when said substrate source bias voltage is lower than said second reference voltage; and a switching circuit, during said programming period, at the least supplying in common said source bias voltage as a source voltage and a substrate voltage to said plurality of nonvolatile memory cells.

13. The device as claimed in claim 7, wherein said substrate source bias circuit includes:

a first comparator, during said programming period, at the least comparing said source voltage or said substrate voltage with a first reference voltage, and reducing said source or substrate voltage when said source or substrate voltage is higher than said first reference voltage;

a second comparator, during said programming period, at the least comparing said source or substrate voltage with a second reference voltage that is lower than said first reference voltage, and increasing said source or substrate voltage when said source of said substrate voltage is lower than said second reference voltage; and a switching unit, during said programming period, at the least supplying in common said source bias voltage as a source voltage and a substrate voltage to said plurality of nonvolatile memory cells.

14. The memory device as claimed in claim 7, wherein said control gates are supplied with a positive voltage during said programming period.

15. A method for programming a nonvolatile semiconductor memory device comprising:

applying a first voltage that is higher, by a predetermined value, than a ground voltage to a source of a memory cell transistor to be programmed;

applying a second voltage to a control gate of said memory cell transistor;

applying a third voltage higher than said first voltage to a drain of said memory cell transistor; and applying a fourth voltage that is higher, by said predetermined value, than a ground voltage to a substrate of said memory cell transistor.

16. The method as claimed in claim 15, wherein said ground voltage is applied to the control gate of a memory cell that is not a programming target and that is not on the same row line as is said memory cell that is to be programmed.

17. The method as claimed in claim 15, wherein said second voltage is a positive voltage.

* * * * *